US006411191B1

(12) United States Patent
Shea et al.

(10) Patent No.: US 6,411,191 B1
(45) Date of Patent: Jun. 25, 2002

(54) CURRENT-LIMITING DEVICE EMPLOYING A NON-UNIFORM PRESSURE DISTRIBUTION BETWEEN ONE OR MORE ELECTRODES AND A CURRENT-LIMITING MATERIAL

(75) Inventors: John J. Shea, Pittsburgh; Jeffrey A. Miller, Coraopolis; William K. Hanna; Stephen A. Mrenna, both of Pittsburgh, all of PA (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 09/694,935

(22) Filed: Oct. 24, 2000

(51) Int. Cl.[7] .................................................. H01L 7/10

(52) U.S. Cl. ..................... 338/22 R; 338/328; 338/332; 338/313; 338/314

(58) Field of Search ........................... 338/22 R, 225 D, 338/328, 332, 313, 314

(56) References Cited

U.S. PATENT DOCUMENTS

| | | | | | |
|---|---|---|---|---|---|
| 3,835,434 | A | * | 9/1974 | Kahn | 338/22 R |
| 3,958,208 | A | * | 5/1976 | Blaha | 338/22 R |
| 4,235,051 | A | * | 11/1980 | Rodriguez | 338/22 R |
| 4,272,471 | A | | 6/1981 | Walker | |
| 4,304,987 | A | | 12/1981 | Van Konynenburg | |
| 4,314,231 | A | | 2/1982 | Walty | |
| 4,426,339 | A | | 1/1984 | Kamath et al. | |
| 4,426,633 | A | | 1/1984 | Taylor | |
| 4,431,983 | A | * | 2/1984 | Rodriguez | 338/22 R |
| 4,485,838 | A | | 12/1984 | Shoji et al. | |
| 4,545,926 | A | | 10/1985 | Fouts, Jr. et al. | |
| 4,647,894 | A | | 3/1987 | Ratell | |
| 4,685,025 | A | | 8/1987 | Carlomagno | |
| 4,689,475 | A | | 8/1987 | Kleiner et al. | |
| 4,724,417 | A | | 2/1988 | Au et al. | |
| 4,743,321 | A | | 5/1988 | Soni et al. | |
| 4,774,024 | A | | 9/1988 | Deep et al. | |
| 4,775,778 | A | | 10/1988 | Van Konynenburg et al. | |
| 4,800,253 | A | | 1/1989 | Kleiner et al. | |
| 4,857,880 | A | | 8/1989 | Au et al. | |
| 4,907,340 | A | | 3/1990 | Fang et al. | |
| 4,910,389 | A | | 3/1990 | Sherman et al. | |
| 4,924,074 | A | | 5/1990 | Fang et al. | |
| 5,049,850 | A | | 9/1991 | Evans | |
| 5,174,924 | A | | 12/1992 | Yamada et al. | |
| 5,195,013 | A | | 3/1993 | Jacobs et al. | |
| 5,378,407 | A | | 1/1995 | Chandler et al. | |
| 5,382,938 | A | | 1/1995 | Hansson et al. | |
| 5,565,826 | A | | 10/1996 | Karlström | |
| 5,602,520 | A | * | 2/1997 | Baiatu et al. | 338/22 R |
| 5,614,881 | A | | 3/1997 | Duggal et al. | |
| 5,644,283 | A | | 7/1997 | Grosse-Wilde et al. | |
| 5,729,189 | A | | 3/1998 | Oya et al. | |
| 5,777,541 | A | | 7/1998 | Vekeman | |
| 5,818,676 | A | * | 10/1998 | Gronowicz, Jr. | 338/22 R |
| 5,859,578 | A | | 1/1999 | Arnold | |
| 5,861,795 | A | | 1/1999 | Glatz-Reichenbach et al. | |
| 5,909,168 | A | * | 6/1999 | Miyasaka et al. | 338/22 R |
| 5,929,744 | A | * | 7/1999 | Duggal et al. | 338/22 R |
| 5,939,968 | A | * | 8/1999 | Nguyen et al. | 338/22 R |
| 5,977,861 | A | * | 11/1999 | Duggal et al. | 338/22 R |
| 6,144,540 | A | * | 11/2000 | Arnold et al. | 338/22 R |

* cited by examiner

*Primary Examiner*—Karl D. Easthom
(74) *Attorney, Agent, or Firm*—Martin J. Moran

(57) ABSTRACT

A current-limiting device includes a current-limiting material, such as a molded thermoset material, and first and second electrodes structured for carrying current through the current-limiting material. The first electrode electrically engages a first portion of the current-limiting material, and the second electrode electrically engages a second portion of the current-limiting material. A mechanism provides a non-uniform pressure distribution between one or both of the first and second electrodes and the current-limiting material.

2 Claims, 9 Drawing Sheets

CURRENT-LIMITING DEVICE EMPLOYING A NON-UNIFORM PRESSURE DISTRIBUTION BETWEEN ONE OR MORE ELECTRODES AND A CURRENT-LIMITING MATERIAL

BACKGROUND OF THE INVENTION

1. Field of the Invention

This invention pertains generally to current-limiting devices and, more particularly, to current-limiting devices including a current-limiting material, such as a conductive polymer, which exhibits a sharp increase in electrical resistance at a threshold current, and also including electrodes, which electrically engage the current-limiting material.

2. Background Information

Current-limiting polymer compositions, which exhibit positive temperature coefficient (PTC) resistive behavior, and electrical devices comprising current-limiting polymer compositions have been widely used. See, for example, U.S. Pat. No. 5,614,881. The current-limiting polymer compositions generally include conductive particles, such as carbon black, graphite or metal particles, dispersed in a polymer matrix, such as a thermoplastic polymer, elastomeric polymer or thermosetting polymer. PTC behavior in a current-limiting polymer composition is characterized by the material undergoing a sharp increase in resistivity as its temperature rises above a particular value known as the switching temperature. Materials exhibiting PTC behavior are useful in a number of applications such as, for example, electrical circuit protection devices, in which the current passing through a circuit is controlled by the temperature of a PTC element forming part of that circuit.

Electrical circuit protection devices comprising current-limiting polymer compositions typically include a current-limiting polymer device having two electrodes embedded in a current-limiting polymer composition. When connected to a circuit, the circuit protection devices have a relatively low resistance under normal operating conditions of the circuit, but are tripped, that is, converted into a high resistance state, when a fault condition or persistent overcurrent condition occurs. Under such conditions, when the circuit protection device is tripped, the current passing through the PTC element causes it to resistively self-heat to its switching temperature, $T_s$, at which a rapid increase in its resistance takes place.

The residual current, which flows through the current-limiting device, allows a series circuit breaker to absorb any stored residual energy (e.g., the majority of such energy is absorbed by the circuit breaker arc chamber during the switching transient and during recovery/reclosing to reestablish the power distribution system voltage) in the power distribution system. Typically, an external current-limiting device engages the load-side terminals of the circuit breaker. For example, a conductive polymer of the current-limiting device is coupled in series with the mechanical circuit breaker separable contacts, in order to limit fault current as those contacts open.

Previous materials used for current-limiting applications in conjunction with low voltage circuit breakers (e.g., less than about 600 VAC) generally consisted of a very brittle blend of conductive filler (i.e., carbon black) of a thermoplastic binder with two spring-loaded metal plates employed as electrodes. These electrodes serve to allow current to flow through the current-limiting material. In this arrangement, approximately 80% of the total device resistance resulted from contact resistance, while only about 20% resulted from bulk material resistance.

U.S. Pat. No. 4,800,253 discloses a metal electrode, such as an electrodeposited copper or nickel foil electrode having a microrough surface, which is in direct physical contact or which is secured to the surface of a conductive polymer element. U.S. Pat. No. 4,800,253 states that columnar electrodes, such as solid or stranded wires, having a microrough surface are embedded in a PTC conductive polymer.

Known high power prior art current-limiting devices, for example, up to about 600 VAC with a rated current of greater than several amperes (e.g., about 10 A to about 63 A), which employ current-limiting polymers (see, e.g., U.S. Pat. No. 5,861,795), also employ a parallel electrical (e.g., wire) shunt to protect the current-limiting material from overvoltage and from the stored system energy (e.g., generally magnetic system energy resulting from system inductance). However, the shunt increases the volume of the package for the current-limiting device and the cost of the overall device.

Typically, relatively low power prior art current-limiting devices, for example, up to typically about 12–24 VDC or higher, with a rated current of less than several tens of milliamperes, which employ current-limiting polymers, do not employ a parallel electrical shunt to protect the current-limiting material.

There is room for improvement in terms of the current-limiting material and electrodes employed in current-limiting devices.

SUMMARY OF THE INVENTION

The present invention provides improvements in the operation of current-limiting devices by providing a non-uniform pressure distribution between one or both of the first and second electrodes and the current-limiting material therebetween. in accordance with the invention, a current-limiting device comprises a current-limiting material; first and second electrodes structured for carrying current through the current-limiting material, with the first electrode electrically engaging a first portion of the current-limiting material, and the second electrode electrically engaging a second portion of the current-limiting material; and means for providing a non-uniform pressure distribution between at least one of the first and second electrodes and the current-limiting material.

The means for providing a non-uniform pressure distribution preferably includes a spring having a predetermined spring rate of about 100 to about 7000 pounds per inch. Highly preferred predetermined spring rates range from about 100 to about 700 pounds per inch, with a predetermined spring rate of about 300 pounds per inch being especially preferred.

Preferably, the first and second electrodes are solely electrically connected by the current-limiting material.

The means for providing a non-uniform pressure distribution may include a pair of supports for edges of at least one of the electrodes, and means for applying a force to the supports, in order to provide the non-uniform pressure distribution.

As one aspect of the invention, the electrodes have a first surface and a second surface which engages the current-limiting material; and the means for providing a non-uniform pressure distribution includes a rubber spring member having a plurality of openings and positioned on the first surface of one of the electrodes, a plate positioned on the rubber spring member, and means for applying a clamping force between the plate and the first surface of the other one of the electrodes, in order to provide the non-uniform pressure distribution.

As another aspect of the invention, the electrodes may have a first portion, a second portion and a third portion. The means for providing a non-uniform pressure distribution includes a first clip and a second clip which engage the first portion and the third portion of the electrodes, respectively, in order to apply a force thereto without engaging the second portion of the electrodes, in order to provide the non-uniform pressure distribution.

Preferably, the first and third portions are side portions of the electrodes, and the second portion is an intermediate portion between the side portions.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
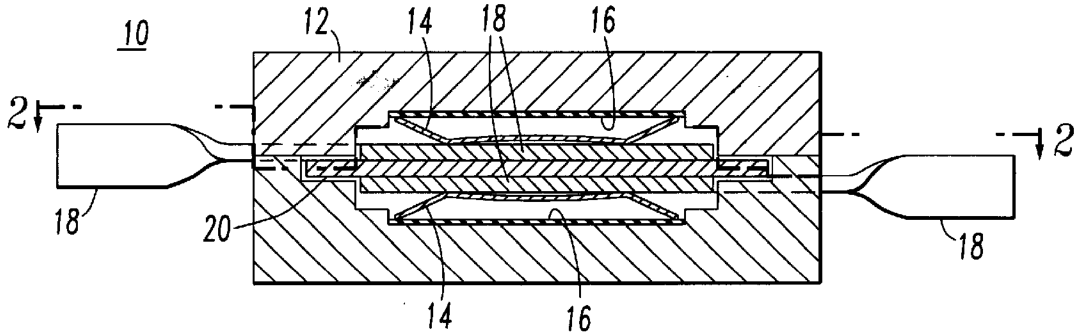
FIG. 1 is a cross-sectional view of one type of a current-limiting polymer device utilizing spring pressure contacts for both electrodes.

Referring to FIG. 1, one type of a low voltage current-limiting resistance device 10, for providing electrical circuit protection for electrical apparatus, is shown. Within a suitable metal or plastic case 12, shown split into two parts, are metal bifold springs 14, resting on polyethylene terephthalate (Mylar) sheets 16, and supporting copper electrodes 18 on each side of a thin polymeric sheet of conductive current-limiting polymer composition 20, which may exhibit PTC behavior.

Figure 2:
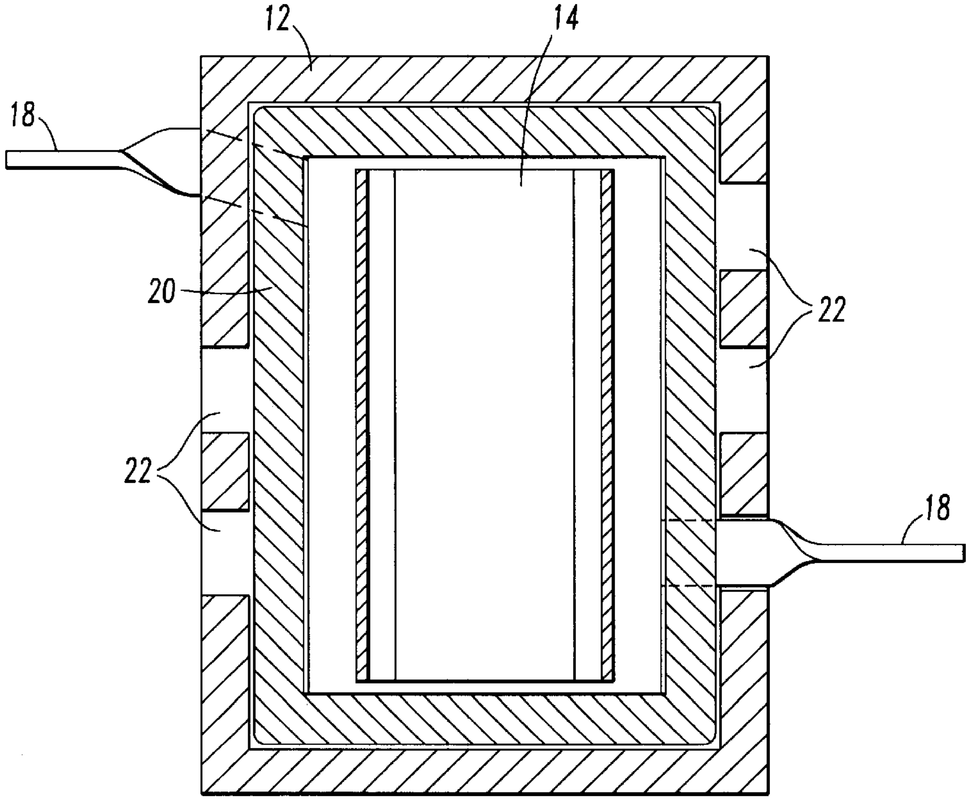
FIG. 2 is a cross-sectional view along lines 2—2 of FIG. 1.

As shown in FIG. 2, the springs 14, the electrodes 18 and vents 22 are further detailed. A wide range of other type springs, such as, for example, wave or compression springs, may be used to provide the contacting relationship between the electrodes 18 and the current-limiting polymer composition 20.

Figure 3:
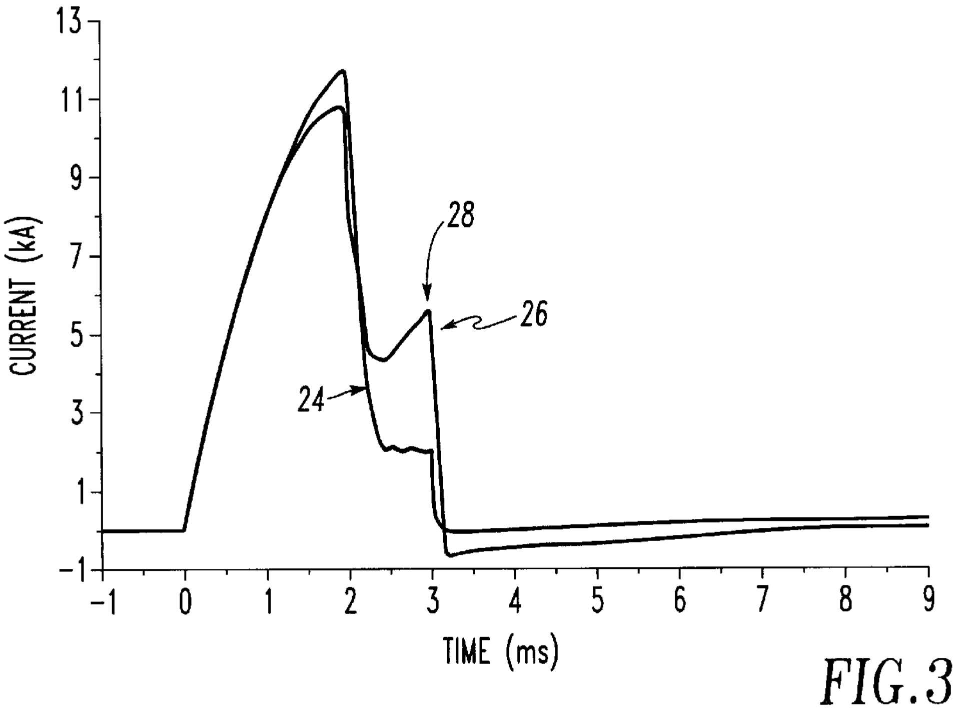
FIG. 3 shows two plots of let-through current versus time for current-limiting devices which do and do not employ a parallel electrical shunt electrically connected between the electrodes to protect a current-limiting polymer.

FIG. 3 shows two plots 24 (with a shunt) and 26 (without a shunt) of let-through current versus time for two current-limiting devices which do (not shown) and do not (e.g., the device 10 of FIGS. 1 and 2) employ a parallel electrical shunt electrically connected between the electrodes to protect the current-limiting polymer (e.g., polyethylene). The sharp drop in current at point 28 of plot 26 is a result of a crowbar circuit (not shown).

Figure 4:
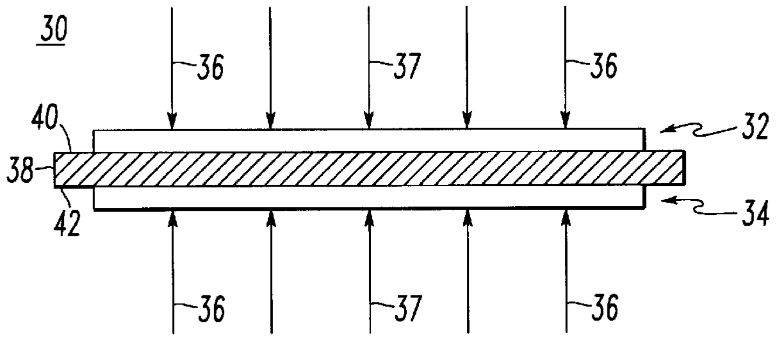
FIG. 4 is a side view of a current-limiting device including two electrodes electrically engaging a current-limiting polymer with a non-uniform pressure distribution in accordance with the present invention.

Referring to FIG. 4, a current-limiting device 30 in accordance with the present invention is shown. Both electrodes 32,34 of the device 30 are pressed by different forces 36,37, in order to make suitable electrical contact with a suitable current-limiting material 38. The magnitude and the stiffness of the forces 36,37 (i.e., the spring rate, k, in pounds per inch), and the pressure distribution on the current-limiting material 38 are factors, which determine the overall current-limiting performance of the device 30. The electrodes 32,34 are structured for carrying current through the current-limiting material 38, with the electrode 32 electrically engaging a first portion 40 of the material 38, and the electrode 34 electrically engaging a second portion 42 of the material 38. The exemplary forces 36 and 37 (one of which might be zero) provide a non-uniform pressure distribution between one or both of the electrodes 32,34 and the current-limiting material 38.

In accordance with a preferred embodiment of the invention, the electrodes 32,34 are solely electrically connected by the current-limiting material 38. Preferably, the electrodes 32,34 are made of any suitably conductive metal, such as, for example, copper, or alloy or any such suitably conductive metal or alloy, which is plated in order to reduce or minimize oxidation. Suitable plating materials for the electrodes 32,34 include, for example, silver, nickel, gold, platinum, and other types of plating metals, which preferably maintain high conductivity over the life of the current-limiting device 30.

U.S. patent application Ser. No. 09/406,534 (Attorney Docket No. 99-PDC-138), filed Sep. 27, 1999, which is incorporated by reference herein, discloses a suitable epoxy based current-limiting material, such as 38, which is moldable, and not brittle upon cure so that it can be finished if necessary. In accordance with the present invention, this current-limiting material 38, when employed in combination with a suitable mechanism for providing a non-uniform pressure distribution, such as forces 36,37, between one or both electrodes 32,34 and that current-limiting material 38, does not require the use of a parallel commutation shunt electrically connected between such electrodes.

Examples of suitable types of current-limiting materials include thermoset (e.g., carbon black filled thermosetting resins), thermoplastic type current-limiting polymers, and elastomeric polymers. Preferably, the current limiting polymer is a mixture of readibly commercially available materials, such as epoxy resins, that are flexible and moldable, can be finished, are not brittle upon cure, and that are cuttable or punchable so they can be inexpensively volume-produced in long sheet form.

Such an epoxy based current-limiting material can be cast as a thin film (e.g., about 40 cm×80 cm and between 0.05 cm and 0.5 cm, usually 0.13 cm (0.05 inch) thick), and then cut into smaller component pieces, for example, 6.1 cm×4.0 cm×0.12 cm thick (i.e., about 2.4 inch×1.6 inch×0.05 inch) without fracturing. Such electrically conducting material exhibits superior flexibility and punchability, electrical conductivity characteristics, and low let-through (i.e., the measure of effectiveness of the current limiter in reducing current and the duration of the current, typically less than $10\times10^3$ $A^2$–s), for use in a current limiting polymer device.

Such electrically conducting material consists essentially of the cured reaction product of: a resin component comprising a mixture of: 100 parts by weight of a short chain aliphatic diepoxide resin and 0 to 15 parts by weight of a bisphenol A epoxy resin, 80 to 150 parts by weight of conductive filler, and curing agent. Preferably the aliphatic diepoxide is the diglycidyl ether of an alkylene glycol, the bisphenol A epoxy resin is present in the range of 1 to 10 parts by weight to add strength to the material, and the curing agent is a borontrifluoride-amine complex. In some instances when no epoxidized bisphenol A epoxy is present a minor amount, about 2 to 20 parts by weight, of an epoxidized polybutadiene may be present.

As further disclosed herein (e.g., in connection with FIGS. 5–8, and 10–18), the combination of: (1) the current-limiting material 38; (2) a suitable mechanical pressure on the electrodes 32,34; and (3) a non-uniform pressure distribution, allows the current-limiting material 38 to continue to conduct current during voltage holdoff (e.g., which occurs during the relatively flat portion 44 of the current plot of FIG. 8 at $I_R$=700 A) when the maximum system voltage is across the current-limiting material 38, but at a significantly reduced current let-through value.

By purposely designing a less than ideal switch, in accordance with the invention, an external shunt is no longer needed for the current-limiting device 30. By having the current driven to a nominal maximum let-through value (e.g., approximately 500 A), the fault current is limited and the magnetic energy in the electrical circuit may, thus, be suitably dissipated. Since, unlike prior proposals, the exemplary current-limiting device 30 does not require a shunting resistance, there is a savings in cost, the package volume is reduced, and efficiency is increased. In contrast, an ideal switch transitions to a resistance that rapidly drives the fault current to zero, thereby causing a high transient voltage to appear across the current-limiting material and, thus, causing the stored magnetic system energy to destroy that current-limiting material.

In accordance with the present invention, the residual current in the current-limiting material 38 is controlled, without the need for a commutating shunt. The ability to continue to conduct current through the current-limiting material 30 depends upon the type of current-limiting material as well as the dynamics of the electrodes 32,34. For example, the spring rate, which provides the mechanical pressure on the electrodes 32,34, is employed to suitably hold such electrodes in electrical contact with the current-limiting material 38, and to control the residual current through such material during the recovery phase (e.g., the relatively flat portion 44 of the current plot of FIG. 8 at $I_R$=700 A).

Figure 5:
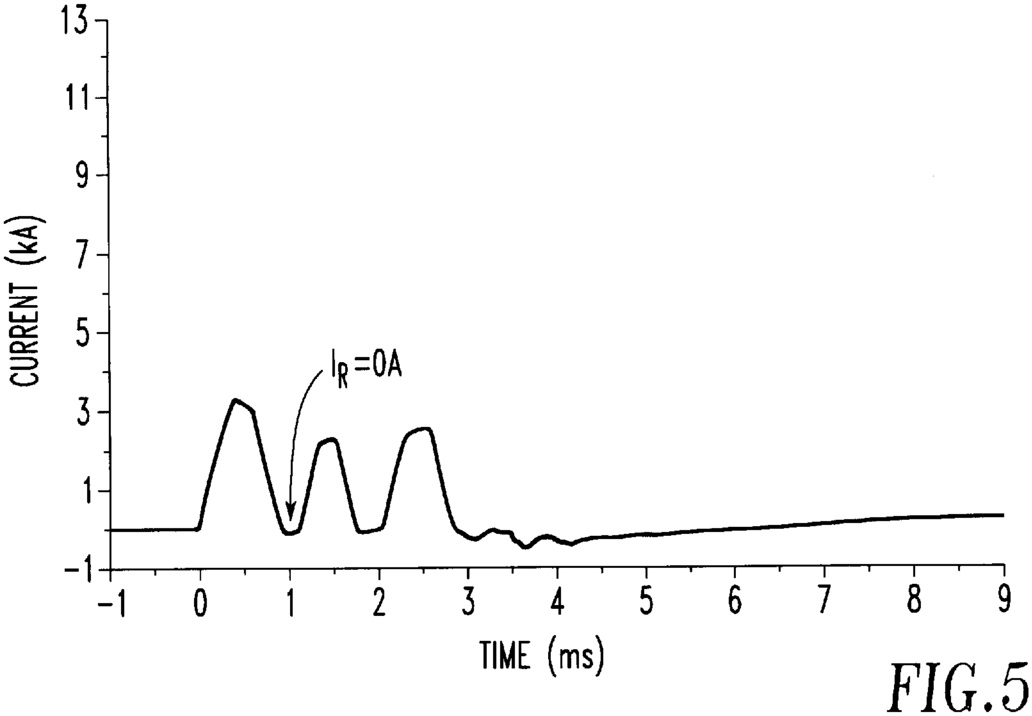
FIGS. 5–8 are plots of let-through current versus time for various current-limiting devices in accordance with the present invention.

Referring to FIG. 5, for springs (e.g., compression springs) having a relatively low spring rate, the electrodes 32,34 of FIG. 4 are easily lifted from the surface of the current-limiting material 38 during a switching transient. Initially, the fault or short circuit current is driven to zero. Then, after about 100 $\mu$s at that level (i.e., $I_R$=0 A), the current-limiting material 38 begins to re-conduct the full current. In turn, after a brief period of full conduction, the current-limiting material 38 then re-transitions and the current again is driven to zero. Such a relatively low spring rate (e.g. k=102 lbs./in.) has the effect of causing the interfaces between the current-limiting material 38 and the electrodes 32,34 to cool off and become a good conductor prior to full recovery. This results in the oscillatory effect as shown in FIG. 5.

Figure 6:
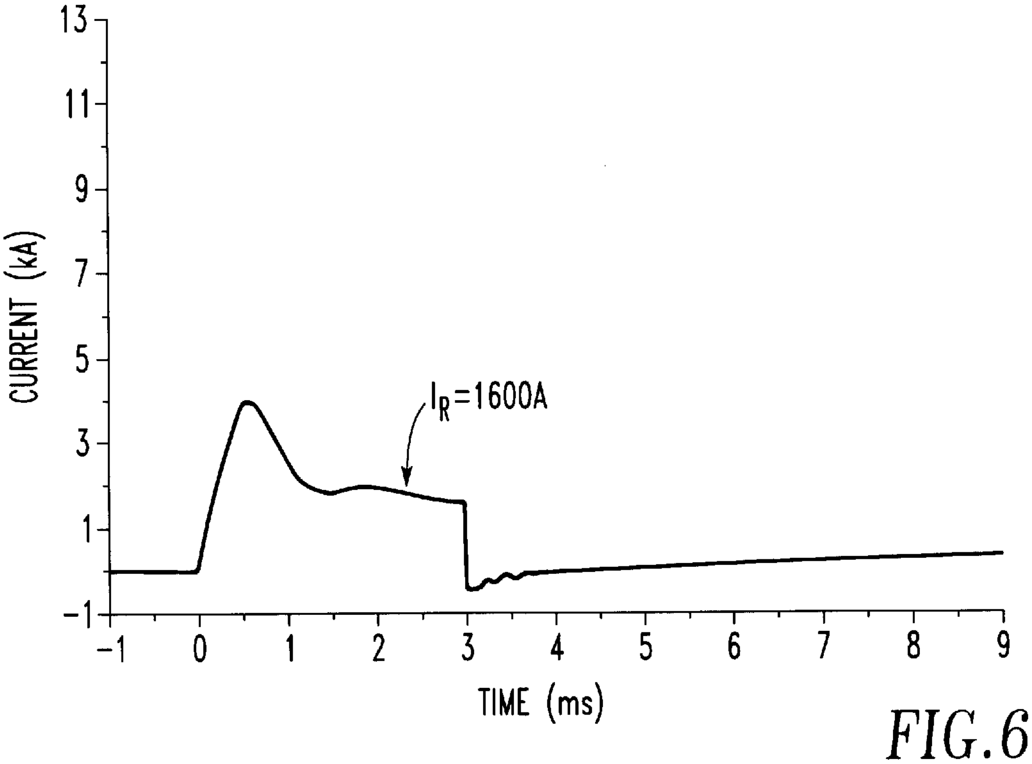
Figure 7:
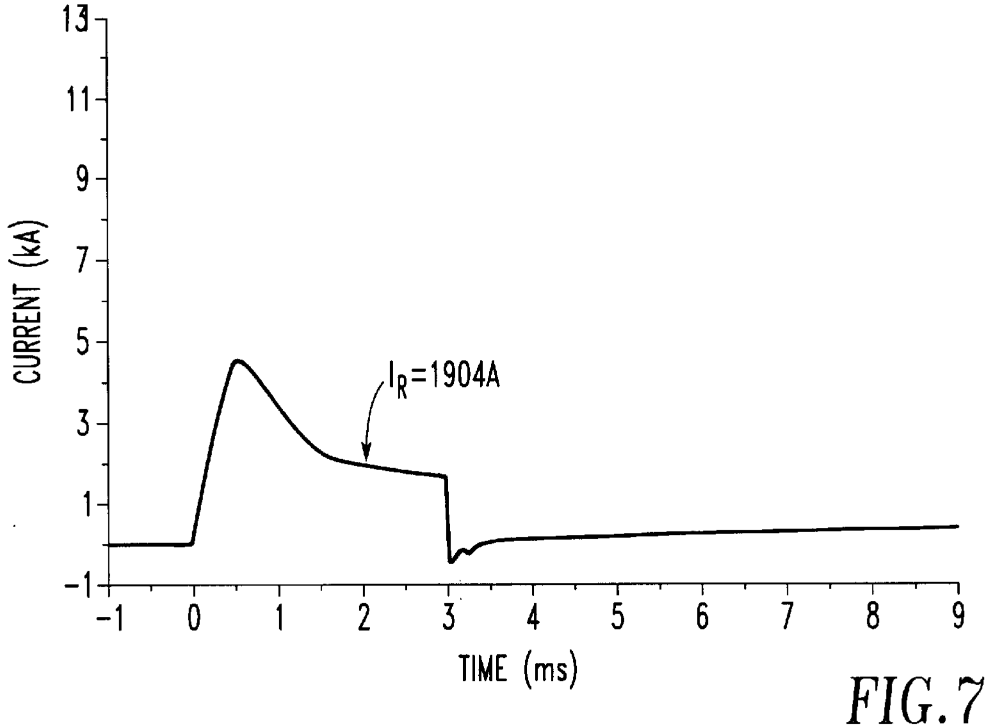
Figure 9A:
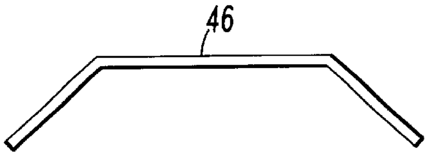
FIG.9A PRIOR ART
FIGS. 9A–9E show schematic representations of a bifold spring, a silicon rubber sheet, a wave spring, a compression spring, and a wave washer, respectively.
Figure 9D:
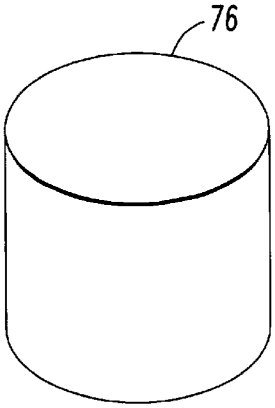
FIG.9D PRIOR ART
Figure 9B:
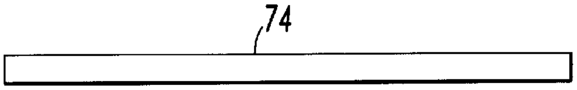
FIG.9B PRIOR ART
Figure 9E:
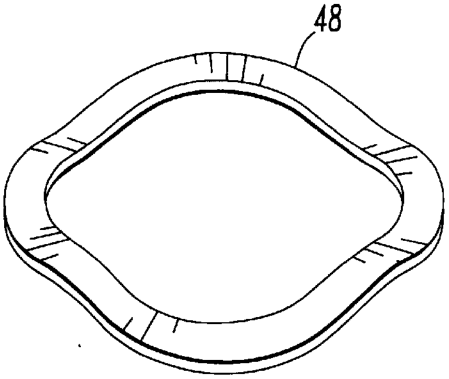
FIG.9E PRIOR ART
Figure 9C:
FIG.9C PRIOR ART

The other extreme is shown by a relatively rigid structure (e.g., a wave spring; silicone rubber), which provides a relatively extremely high spring rate (e.g. k=5000 lbs./in. of the wave spring 50 of FIG. 9C; k=6,666 lbs./in. of silicon rubber 74 of FIG. 9B). In this case, the electrodes 32,34 are not allowed to lift-off the surface of the current-limiting material 38, but are held rather firmly onto, but not embedded into (see, e.g., commonly assigned application Ser. No. 09/699,887, the current-limiting material 38 during the entire switching transient. This results in a relatively high residual current (e.g., $I_R$=1600 A; $I_R$=1904 A), as shown in FIGS. 6 and 7. With such higher values of residual current, there are corresponding greater values of let-through current.

Hence, one possible goal is to maintain a relatively low residual current and to minimize re-conduction. This allows for inductive energy to be safely dissipated. However, re-conduction per se does not cause damage to the current-limiting material 38, but only causes a minimal increase in let-through current.

Figure 8:
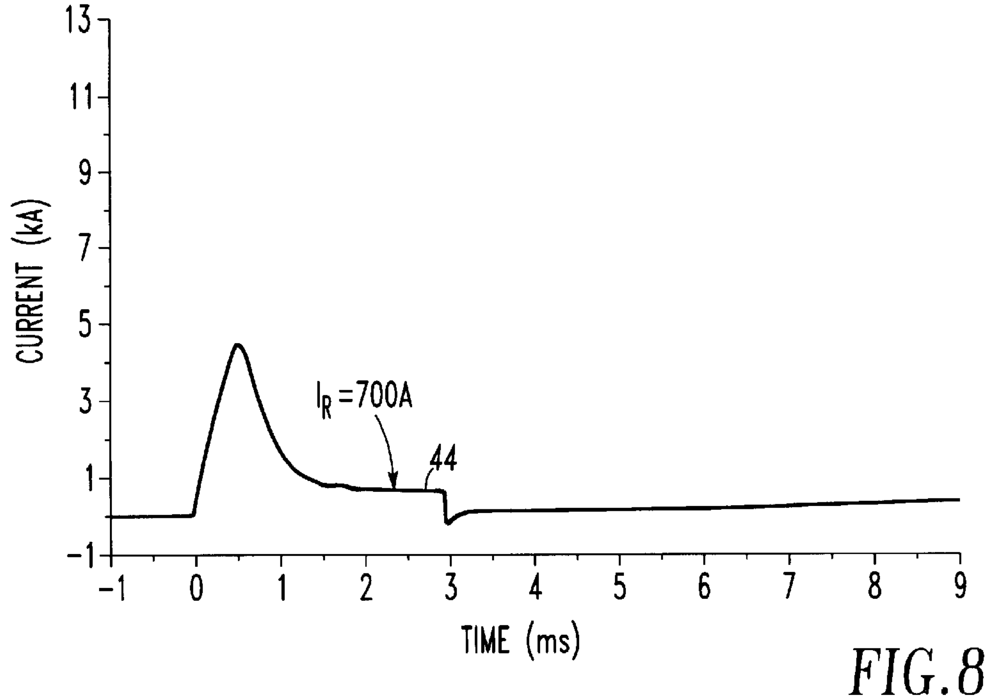

As shown in FIG. 8, a spring with a suitable spring-rate (e.g. k=333 lbs./in. as provided by the bifold spring 46 of FIG. 9A; k=714 lbs./in. as provided by the wave washer 48 of FIG. 9E, such a washer which is folded similar to the wave spring 50 of FIG. 9C, such as a Wave Spring Lock Washer distributed by McMaster-Carr) is selected to produce a suitable current waveform (e.g., $I_R$=475 A of the bifold spring 46 of FIG. 9A; $I_R$=700 A of FIG. 8 for the clamping force 94 of FIGS. 14 and 15; $I_R$=750 A for the wave washer 48 of FIG. 9E). This spring rate preferably produces a minimum let-through current value and does not result in re-conduction.

The gas pressure produced from the vaporization of the interfaces between the electrodes 32,34 and the current-limiting material 38 of FIG. 4 during the switching transient is also important in obtaining the desired residual current. By controlling venting of the gas, the amount of force applied to the case (e.g., the case 12 of FIG. 1), during the transient, also affects the residual current. Sealing the case 12 would, however, result in a greater force to such case and case rupture. In contrast, as shown in Table 1 and FIG. 12, by venting the gas pressure and appropriately selecting the proper spring, the residual current is reliably controlled.

TABLE 1

| Description | Spring Rate, k (lbs./in.) | Residual Current, $I_R$ (A) |
|---|---|---|
| Compression | 102 | 0 |
| BiFold | 333 | 475 |
| Wave Washer | 714 | 750 |
| Wave Spring | 5000 | 1600 |
| Silicone Rubber | 6666 | 1904 |

The exemplary current-limiting devices disclosed herein employ mechanisms that provide a non-uniform pressure distribution and include a suitable spring having a predetermined spring rate, such as the exemplary spring rates of Table 1. As shown in Table 1, the predetermined spring rate is about 100 to about 7000 pounds per inch. Preferably, the predetermined spring rate is about 100 to about 700 pounds per inch, with a spring rate of about 300 pounds per inch providing minimum let-through current value without re-conduction. As discussed above, the selected spring rate is important in determining the resulting switching properties of the current-limiting devices. For example, spring rate determines the residual current, $I_R$, which has a large affect on the let-through energy.

For an exemplary spring, which is compressed 0.1 inch, with a spring rate of 333 pounds per inch, and with an electrode having a surface area of 0.3 square inches, the resulting total pressure would be 111 PSI (i.e., 333 lbs./in. ×0.1 in./0.3 in.$^2$).

The mechanical pressure distribution on the surface of the current-limiting material 38 is also important in determining the residual current waveform. When the force is uniformly distributed over the entire electrode surface (e.g., 2.88 in.$^2$ in the exemplary embodiment), the pressure is relatively low (e.g., typically less than 20 PSI). This relatively low pressure typically produces waveforms with re-conduction (as shown in FIG. 5) or relatively high residual current (as shown in FIGS. 6 and 7) depending on the spring rate.

Figure 12:
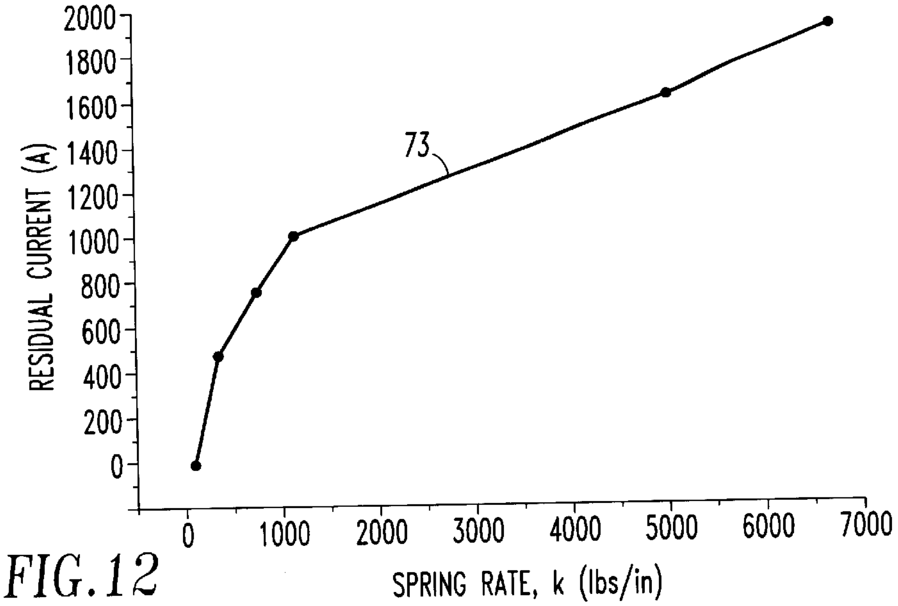
FIG. 12 is a plot of residual current versus spring rate.
Figure 13:
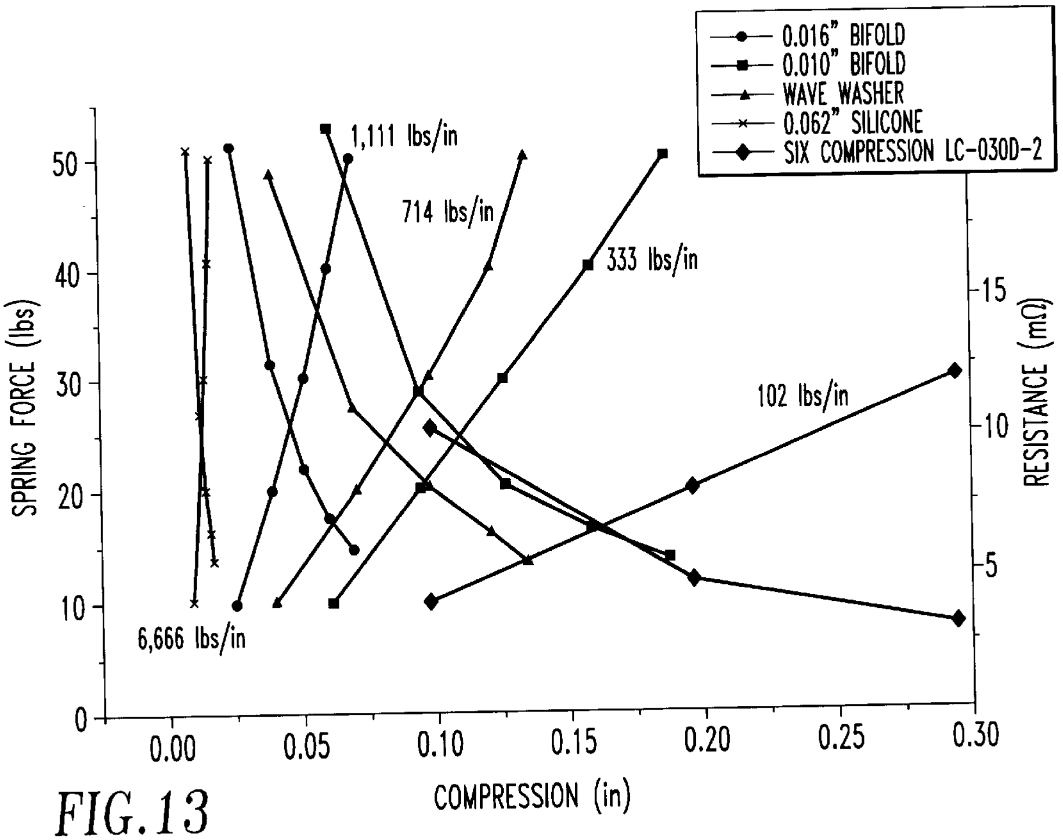
FIG. 13 shows plots of spring force and resistance versus spring compression for five different spring types in accordance with the present invention.

With reference to FIGS. 5–8, the current-limiting material 38, the electrodes 32,34, and the forces 36,37 of FIG. 4 are cooperatively structured for: (1) limiting a maximum let-through current to about 475 amperes to about 750 amperes (see FIGS. 8, 14 and 15; 9A; or 9E); (2) minimizing or eliminating re-conduction through the current-limiting material 38 (FIGS. 6–8); and (3) through appropriate selection (as shown in FIGS. 12 and 13), providing a predetermined residual let-through current through the current-limiting material 38, and a predetermined spring rate for the forces 36,37.

FIGS. 9A–9E show exemplary conventional springs 46,74,50,76,48, which provide suitable spring rates for use by the improved current-limiting devices disclosed herein.

Figure 10:
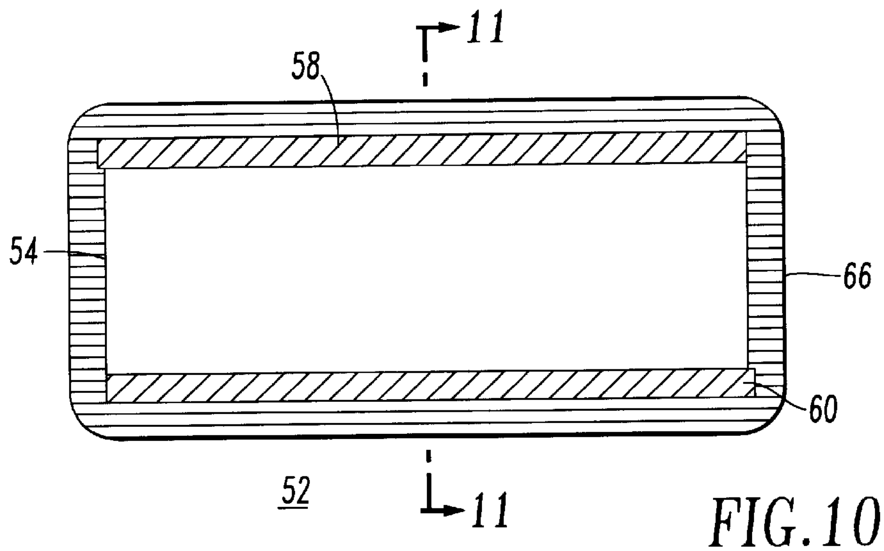
FIG. 10 is a plan view of a current-limiting device including an electrode, edge supports, and a current-limiting material in accordance with an embodiment of the present invention.
Figure 11:
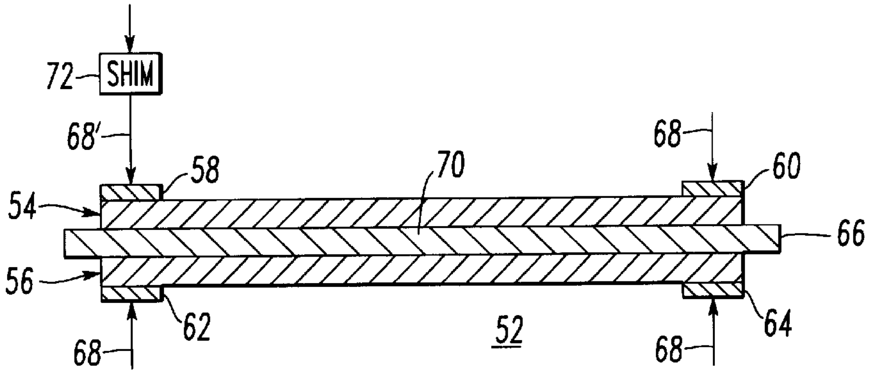
FIG. 11 is a cross-sectional view along lines 11—11 of FIG. 10.

FIGS. 10 and 11 show a current-limiting device 52 including electrodes 54,56, edge supports 58,60,62,64, and a suitable current-limiting polymer material 66 in accordance with an embodiment of the present invention. Although four exemplary edge supports 58,60,62,64, two for each of the electrodes 54,56, are shown, only one pair (e.g., 58 and 60; 62 and 64; 58 and 62; 60 and 64) may be employed. In the exemplary embodiment, suitable forces 68,68'(which may be equal or different), such as spring forces, are applied to the edge supports 58,60,62,64, in order to provide the non-uniform pressure distribution between both of the two electrodes 54,56 and the current-limiting material 66. Here, as a result of the edge supports 58,60, 62,64, minimal force is applied to the central portion 70 of the current-limiting material 66. As shown in FIG. 11, one or more shims 72 may be employed to suitably adjust the force 68', at a desired spring rate, as applied to the support 58.

Figure 17:
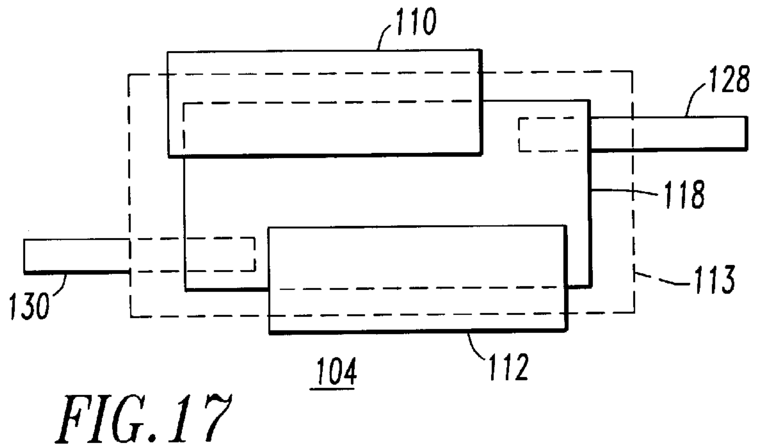
FIG. 17 is a plan view of the current-limiting device of FIG. 16.
Figure 14:
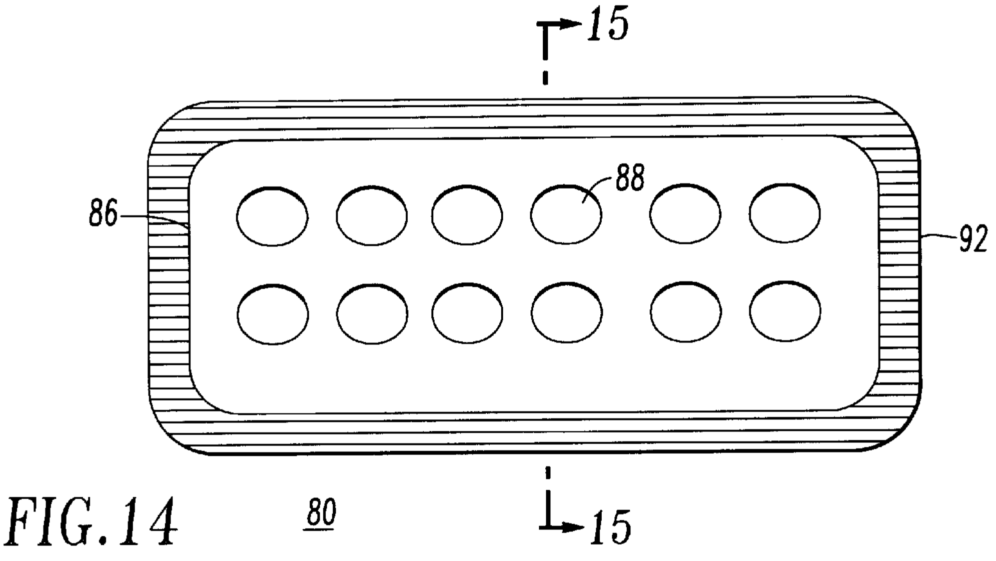
FIG. 14 is a plan view of a current-limiting device including an electrode, a silicone spring having holes therein, a backing plate, and a current-limiting material in accordance with another embodiment of the present invention.
Figure 15:
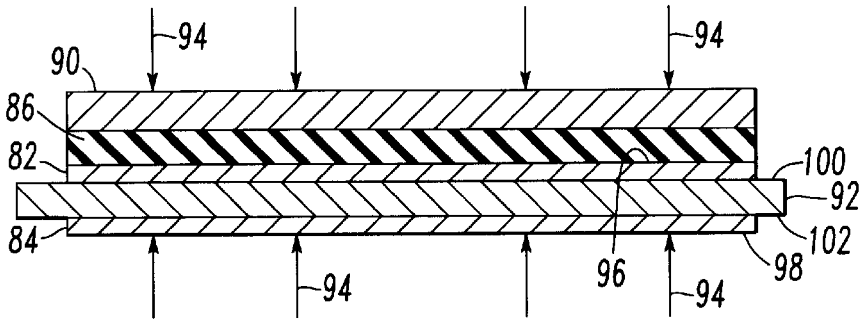
FIG. 15 is a cross-sectional view along lines 15—15 of FIG. 14.
Figure 16:
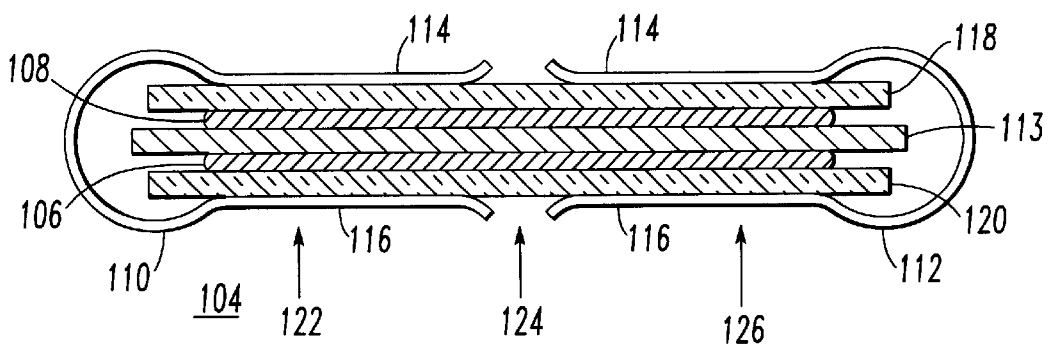
FIG. 16 is a cross-sectional view of a current-limiting device including two electrodes, two "money-clip" springs, and a current-limiting material in accordance with another embodiment of the present invention.
Figure 18:
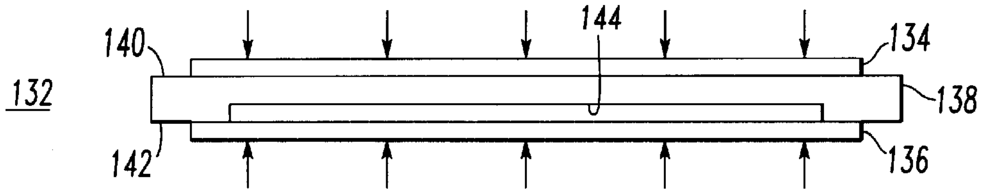
FIGS. 18–20 are side views of other current-limiting devices in accordance with other embodiments of the present invention.
Figure 19:
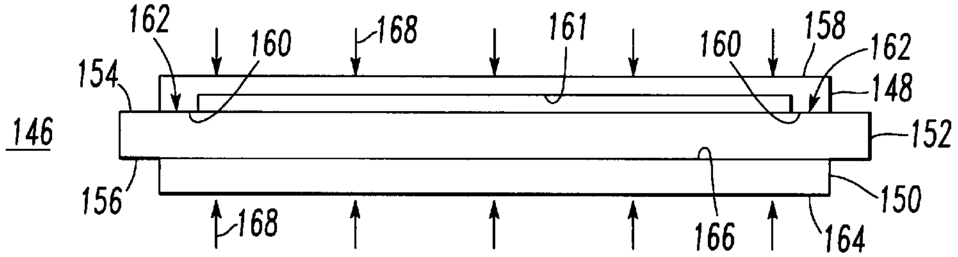

In addition, non-uniform loading may be produced by varying the spring type. For example, various alternatives to the edge loading of FIGS. 10 and 11 to distribute the force unequally on the electrodes 54,56, in order to produce non-uniform pressure distributions, may be achieved by numerous other mechanisms, which include, but are not limited to, the following types: (1) punching holes 88 in silicone rubber 86 and employing a relatively thin (e.g., 0.010" thick) electrode 82, which deforms at the hole locations of the silicone rubber, thereby producing a non-uniform pressure distribution (as shown in FIGS. 14 and 15); (2) employing a suitable clamping structure 110,112 as shown in FIGS. 16–17 in order to produce unequal forces on the electrodes 106,108; (3) suitably forming a valley or depression 144 in the polymer surface 142 as shown in FIG. 18; and (4) suitably forming one or more ridges 162 on the second surface 160 of an electrode 148 to engage the surface 154 of the current-limiting material 152 as shown in FIG. 19. Furthermore, shims 72 (e.g., the wave washer 48 of FIG. 9E) may be employed to adjust the compression and the spring force 68 in order to provide a desired force or unequal forces between, for example, the edge supports 58,60,62,64 of FIGS. 10 and 11.

Selection of the spring forces 68,68' of FIG. 11 is guided by FIG. 12, which shows a plot 73 of residual current ($I_R$) versus spring-rate (k, lbs./in.) for an exemplary 5 mΩ current-limiting material. Selection of the spring forces 68,68' is also guided by FIG. 13, which shows various plots of spring force (lbs.) and resistance (mΩ) versus spring compression (in.) for five different exemplary spring types: (1) a 0.016" bifold spring (k=1,111 lbs./in.); (2) the 0.010" bifold spring 46 of FIG. 9A (k=333 lbs./in.); (3) the wave washer 48 of FIG. 9E (k=714 lbs./in.); (4) a silicone rubber sheet, such as 0.062" silicone rubber 74 of FIG. 9B (k=6,666 lbs./in.); and (5) six parallel compression springs (e.g., a Lee Spring Co. LC-030D-2 compression spring 76 of FIG. 9D configured in the manner of a mattress (not shown)) (k=102 lbs./in.). In these plots of FIG. 13, spring force increases with increasing compression, while resistance decreases with increasing compression.

Referring to FIGS. 14 and 15, a current-limiting device 80 is shown including exemplary foil electrodes 82,84; a rubber spring member, such as a silicone rubber spring 86 having a plurality of holes 88 therein; a backing plate 90 (for convenience of illustration, the plate 90 is only shown in FIG. 15); and a suitable current-limiting material 92. A suitable clamping force 94 is provided between the backing plate 90 and the second electrode 84. The electrodes 82,84 have respective first surfaces 96,98 and second surfaces 100,102, which engage opposite surfaces of the current-limiting material 92. The rubber spring member 86 is positioned on the first surface 96 of the first electrode 82. The plate 90 is positioned on the rubber spring member 86. A suitable clamping mechanism, such as the case 12 of FIG. 1, applies the clamping force 94 between the plate 90 and the first surface 98 of the second electrode 84. The first electrode 82 deforms at locations corresponding to the holes 88 of the silicone rubber 86, in order to produce the non-uniform pressure distribution between the electrode 82 and the current-limiting material 92.

The exemplary spring rate of FIG. 8 is achieved by employing a suitable clamping force 94 as shown in FIGS. 14 and 15, which flexes the case, such as the case 12 of FIG.

1, along with the piece of silicone rubber 86. The combination of the relatively stiff silicone rubber 86 and case flexure during a switching transient produces the desired current waveform of FIG. 8.

When the differential pressure is increased (e.g., to greater than 40 PSI) by non-uniformly loading the electrodes 54,56 (e.g., by employing edge loading as shown in FIGS. 10 and 11), or pattern loading of the electrode 82 (e.g., as shown in FIGS. 14 and 15), then the desired low residual current is provided without any re-conduction. This, however, is at the expense of increases in the let-through current, due to the relatively higher spring force needed to obtain the desired package resistance over the smaller area of contact, and increases in erosion of the current-limiting material 66,92 at the areas of relatively higher pressure.

Accordingly, there is a desired optimum between pressure distribution and spring rate in order to minimize let-through current. In addition, package cost versus performance is another factor. The optimum combination of spring materials and pressure distribution on the current-limiting material that results in the desired relatively low residual current, without re-conduction, may only be slightly better in performance than a relatively lower cost, longer life, alternative design.

Referring to FIGS. 16–17, another current-limiting device 104 is shown including two exemplary copper electrodes 106,108, two exemplary "money-clip" springs 110,112, and a suitable current-limiting polymer material 113. Disposed between the opposing clip spring clamping members 114, 116 and the corresponding electrodes 108,106 are suitable insulators in the form of red glass polyester 118,120, respectively. The electrodes 106,108 have a first portion 122, a second portion 124, and a third portion 126. The clip springs 110,112 engage the first or side portion 122 and the third or side portion 126, respectively, of the electrodes 106,108, in order to apply a force thereto without engaging the second or intermediate portion 124 of the electrodes 106,108, in order to provide the non-uniform pressure distribution.

In accordance with a preferred practice of the invention, the electrodes 106,108 are solely electrically connected by the current-limiting material 113. External electrical connections to the electrodes 106,108 are preferably provided by exemplary electrical conductors 128,130 (shown in FIG. 17), respectively, which are suitably electrically connected (e.g., welded, brazed) to the electrodes 106,108 or which, alternatively, are made part of such electrodes.

FIG. 18 shows a current-limiting device 132 in accordance with another embodiment of the present invention. The device includes electrodes 134,136 and a suitable current-limiting material 138. The current-limiting material 138 has a first surface 140 and a second surface 142 which are engaged by the electrodes 134,136, respectively. The second surface 142 has a depression 144 therein. The first electrode 134 engages the first surface 140 of the current-limiting material 138, and the second electrode 136 engages the second surface 142 of the current-limiting material 138, in order to provide a suitable non-uniform pressure distribution between the ends and central portion thereof.

FIG. 19 shows another current-limiting device 146 in accordance with another embodiment of the invention. The device includes electrodes 148,150 and a suitable current-limiting material 152. The current-limiting material 152 has a first surface 154 and a second surface 156 which are engaged by the electrodes 148,150, respectively. The first electrode 148 has a first surface 158 and a second surface 160 which engages the first surface 154 of the current-limiting material 152. The second surface 160 has a depression 161 and one or more ridges 162 thereon (e.g., without limitation, formed by machining, milling, molding, extrusion), with such ridged second surface 160 engaging the first surface 154 of the current-limiting material 152. The second electrode 150 has a first surface 164 and a second surface 166 which engages the second surface 156 of the current-limiting material 152. A suitable mechanism, such as, for example, the case 12 of FIG. 1, applies a suitable force 168 to the first surfaces 158,164 of the respective electrodes 148,150.

Figure 20:
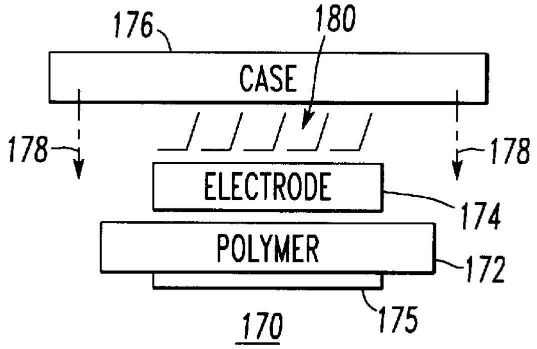

FIG. 20 shows another current-limiting device 170 in accordance with another embodiment of the invention. The device includes a suitable current-limiting material 172 between two electrodes 174,175. A case 176 (only the upper portion is shown) applies a force 178 to compress a leaf spring 180, which, in turn, applies a suitable non-uniform pressure distribution to the upper electrode 174.

A wide variety of different types of springs may be employed to provide the desired force and spring rate in a given dimension. Such spring types include, but are not limited to: (1) the flat or bifold spring 46 of FIG. 9A; (2) one or more cantilever springs (e.g., in the manner of a diving board) (not shown); (3) Belleville or wave washer 48 of FIG. 9E; (4) the wave spring 50 of FIG. 9C; (5) an elastomeric sheet (e.g., the silicone rubber sheet 74 of FIG. 9B, other rubber or elastomeric sheets); (6) one or more of the compression springs 76 of FIG. 9D; (7) one or more tension springs (not shown, as contrasted with the compression spring 76 of FIG. 9D); and (8) a leaf spring 180 of FIG. 20.

In addition to the exemplary springs disclosed herein, other suitable types of springs (not shown) for providing a spring force include: (a) a helical coil, non-linear compression spring, (b) a conical coil spring, (c) a torsion spring, and/or (d) a disc spring (which is similar to the wave washer 48 of FIG. 9E, but without a central hole).

In addition to conventional spring materials, other types of materials, such as springs made of shaped memory alloys, which provide a temperature dependent force, may be employed to provide the desired spring force when the temperature changes. These spring materials may advantageously be employed in a thermal protective device.

Any suitable spring-like enclosing package (e.g., the case 12 of FIG. 1) for a suitable current-limiting material may also be employed. Although exemplary package and current-limiting polymer material sizes, shapes and electrode/current-limiting polymer connections have been disclosed herein, a wide range of such sizes, shapes and connections may be employed within the spirit of the present invention.

Figure 21:
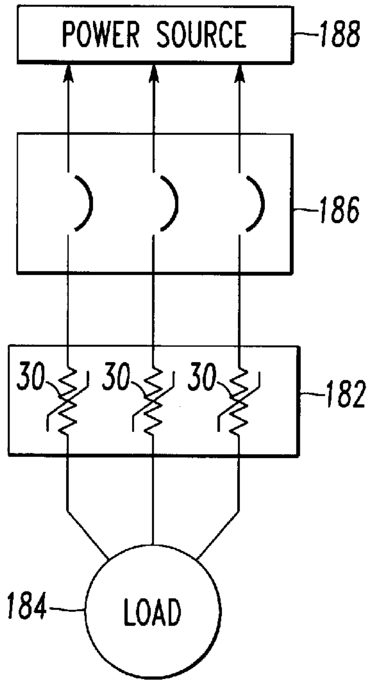
FIG. 21 is a schematic diagram showing one use of the current-limiting device of this invention in conjunction with a three-phase circuit breaker.

FIG. 21 shows a conductive polymer current-limiting resistance device 182, including a plurality (e.g., three) of the conductive polymer current-limiting devices 30 of FIG. 4, which devices are connected electrically in series with three power lines between a three-phase load 184 and a three-phase circuit breaker 186, with a three-phase power source shown as 188. As the current-limiting polymer material 38 (FIG. 4) in one of the devices 30 undergoes a sharp increase in resistivity due to a large influx of current in one of the phases of the power circuit, its temperature rises above its switching temperature, $T_s$, at which a rapid increase in its resistance takes place to transform it to a high resistance state.

While specific embodiments of the invention have been described in detail, it will be appreciated by those skilled in the art, that various modifications and alternatives to those details could be developed in light of the overall teachings of the disclosure. Accordingly, the particular arrangements disclosed are meant to be illustrative only, and not limiting as to the scope of invention which is to be given the full breadth of the claims appended and any and all equivalents thereof.

What is claimed is:

1. A current-limiting device comprising:

a current-limiting material;

first and second electrodes structured for carrying current through said current-limiting material, said first electrode electrically engaging a first portion of said current-limiting material, said second electrode electrically engaging a second portion of said current-limiting material; and means for providing a non-uniform pressure distribution between at least one of said first and second electrodes and said current-limiting material, wherein said electrodes have a first surface and a second surface which engages said current-limiting material; and wherein said means for providing a non-uniform pressure distribution includes a rubber spring member having a plurality of openings, said rubber spring member being positioned on the first surface of one of said electrodes, a plate positioned on said rubber spring member, and means for applying a clamping force to clamp said rubber spring member and said one of said electrodes between said plate and the first surface of the other one of said electrodes, in order to provide said non-uniform pressure distribution.

2. The current-limiting device of claim 1, wherein said rubber spring member is made of silicone rubber and has holes therein, in order to provide said openings; and wherein said one of said electrodes deforms at locations corresponding to the holes of said silicone rubber, in order to produce said non-uniform pressure distribution.

* * * * *